(12) United States Patent
Guo et al.

(10) Patent No.: US 12,317,519 B2
(45) Date of Patent: May 27, 2025

(54) CONTAMINANT COLLECTION ON SOI

(71) Applicant: Texas Instruments Incorporated, Dallas, TX (US)

(72) Inventors: Honglin Guo, Dallas, TX (US); Zachary K Lee, Fremont, CA (US); Jingjing Chen, Santa Clara, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/408,001

(22) Filed: Jan. 9, 2024

(65) Prior Publication Data
US 2024/0145603 A1 May 2, 2024

Related U.S. Application Data

(63) Continuation of application No. 17/665,497, filed on Feb. 5, 2022, now Pat. No. 11,901,462.

(51) Int. Cl.
| | |
|---|---|
| *H01L 29/94* | (2006.01) |
| *H10D 1/00* | (2025.01) |
| *H10D 1/66* | (2025.01) |
| *H01L 21/265* | (2006.01) |
| *H01L 21/266* | (2006.01) |
| *H10D 64/01* | (2025.01) |

(52) U.S. Cl.
CPC ............... *H10D 1/66* (2025.01); *H10D 1/048* (2025.01); *H01L 21/26513* (2013.01); *H01L 21/26586* (2013.01); *H01L 21/266* (2013.01); *H10D 64/01* (2025.01)

(58) Field of Classification Search
CPC ............... H01L 29/94; H01L 29/66189; H01L 21/26513; H01L 21/26586; H01L 21/266; H01L 29/401; H01L 27/1203; H01L 21/3226
See application file for complete search history.

(56) References Cited

U.S. PATENT DOCUMENTS

| | | | |
|---|---|---|---|
| 7,192,834 B2 * | 3/2007 | Hsu ................... | H01L 29/66659 257/E21.336 |
| 2010/0226166 A1 | 9/2010 | Jung | |

* cited by examiner

*Primary Examiner* — David Vu
(74) *Attorney, Agent, or Firm* — Yudong Kim; Frank D. Cimino

(57) ABSTRACT

An integrated circuit includes an SOI substrate having a semiconductor layer over a buried insulator layer; the semiconductor layer contains white space regions that include a PWELL region. An electronic device includes an NWELL region in the semiconductor layer, a dielectric over the NWELL region, and a polysilicon plate over the dielectric. A sacrificial NWELL ring is adjacent to and separated from the NWELL region by a first gap.

24 Claims, 19 Drawing Sheets

CONTAMINANT COLLECTION ON SOI

CROSS-REFERENCE TO RELATED APPLICATIONS

This application is a continuation of application Ser. No. 17/665,497 filed Feb. 5, 2022, and is related to the following United States non-provisional patent application(s): "CONTAMINANT COLLECTION ON SOI," U.S. application Ser. No. 17/665,501, filed Feb. 5, 2022, in the name(s) of Honglin Guo and Frank John Sweeney, both of which are hereby incorporated by reference in their entirety.

BACKGROUND

When contaminants are formed during the fabrication of integrated circuits (ICs), the contaminants are largely attracted to the backside of a bulk wafer. However, when the fabrication takes place on semiconductor-on-insulator (SOI) wafers, the different conditions may cause the majority of contaminants to be deposited on the front-side of the SOI wafer, where active devices are formed. Current solutions require a separate mask for getter regions and consume precious die area, so new solutions are desired.

SUMMARY

Vulnerable devices include capacitors and other electronic devices that have N-type well (NWELL) regions underneath a polysilicon plate and that are located near white space regions, which are generally P-type well (PWELL) regions. Disclosed implementations have an SOI substrate that contains sacrificial N-type well (NWELL) rings that protect the NWELL regions of these vulnerable devices by forming an attractive barrier between the active NWELL regions and adjacent white space. The sacrificial NWELL rings are fabricated at the same time as other NWELL regions, so that no additional masks are necessary to provide the protection.

In one aspect, an implementation of an integrated circuit is disclosed. The integrated circuit includes an SOI substrate having a semiconductor layer over a buried insulator layer; the semiconductor layer contains white space regions that include a PWELL region. An electronic device includes an NWELL region in the semiconductor layer, a dielectric over the NWELL region, and a polysilicon plate over the oxide. A sacrificial NWELL ring is adjacent to and spaced apart from the electronic device and is between the electronic device and the white space regions.

In another aspect, an implementation of a method of fabricating an integrated circuit is disclosed. The method includes providing an SOI substrate that includes a buried insulator layer, forming an NWELL region and a sacrificial NWELL ring in a semiconductor layer of the SOI substrate, and forming a PWELL region in a white space region of the semiconductor layer on a first side of the NWELL region. The sacrificial NWELL ring is located between the NWELL region and the white space region. The method also includes forming a dielectric over the NWELL region and forming a polysilicon plate over the dielectric.

In yet another aspect, an implementation of an integrated circuit is disclosed. The integrated circuit includes an SOI substrate having a silicon layer over a buried oxide layer, with the silicon layer containing white space regions that includes a PWELL region. The integrated circuit also has a capacitor that includes an NWELL region formed in the silicon layer, an oxide formed over the NWELL region, and a polysilicon plate formed over the oxide. A first sacrificial NWELL ring is adjacent to and spaced apart from the capacitor and a second sacrificial NWELL ring is adjacent to and spaced apart from the first sacrificial NWELL ring. The second sacrificial NWELL ring is between the first sacrificial NWELL ring and the white space regions.

BRIEF DESCRIPTION OF THE DRAWINGS

Implementations of the present disclosure are illustrated by way of example, and not by way of limitation, in the figures of the accompanying drawings in which like references indicate similar elements. It should be noted that different references to "an" or "one" implementation in this disclosure are not necessarily to the same implementation, and such references may mean at least one. Further, when a particular feature, structure, or characteristic is described in connection with an implementation, it is submitted that it is within the knowledge of one skilled in the art to effect such feature, structure, or characteristic in connection with other implementations whether or not explicitly described. As used herein, the term "couple" or "couples" is intended to mean either an indirect or direct electrical connection unless qualified as in "communicably coupled" which may include wireless connections. Thus, if a first device couples to a second device, that connection may be through a direct electrical connection, or through an indirect electrical connection via other devices and connections.

The accompanying drawings are incorporated into and form a part of the specification to illustrate one or more exemplary implementations of the present disclosure. Various advantages and features of the disclosure will be understood from the following Detailed Description taken in connection with the appended claims and with reference to the attached drawing figures in which:

DETAILED DESCRIPTION

Specific implementations will now be described in detail with reference to the accompanying figures. In the following detailed description of implementations, numerous specific details are set forth in order to provide a more thorough understanding of the disclosure. However, it will be apparent to one of ordinary skill in the art that other implementations may be practiced without these specific details. In other instances, well-known features have not been described in detail to avoid unnecessarily complicating the description.

Figure 7A:
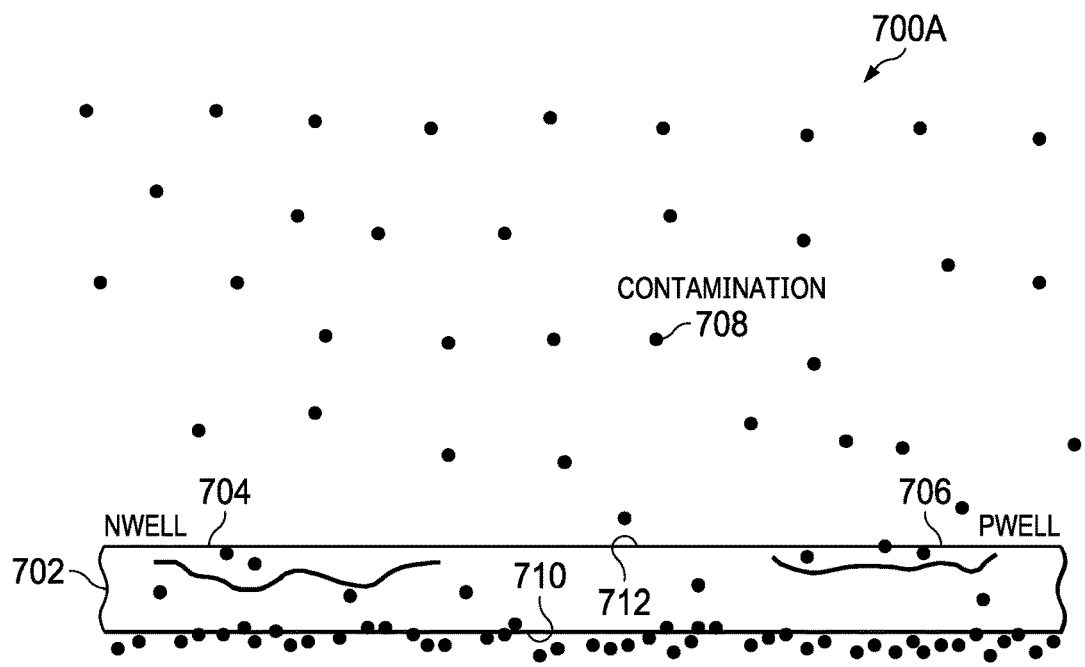
FIG. 7A depicts an IC fabricated using bulk silicon and demonstrates a typical distribution of generated contaminants.

FIG. 7A depicts a simplified schematic of an IC 700A that is being fabricated on a bulk silicon substrate 702, which may have an epitaxial layer (not shown) formed thereon. An NWELL region 704 and a PWELL region 706 have been formed at the surface. As the IC 700A is fabricated, contaminants 708 are formed and may settle on the bulk silicon substrate 702. Rougher regions of the bulk silicon substrate 702 tend to attract these contaminants; and contaminants that do not land on rougher regions tend to migrate through the silicon to reach rougher regions.

The most "attractive" region in the bulk silicon substrate 702 is on a backside region 710 of the substrate, which is not polished after being sliced from a cylindrical boule. Although the front side 712 of the bulk silicon substrate 702 is polished, implantation of dopants will disrupt and roughen the surface, especially if the dopant is large and/or energetically implanted. Both phosphorus and arsenic, which are N-type dopants, are larger atoms than boron, a commonly used P type dopant. Because of the rougher surface over an NWELL region as opposed to a PWELL region, the NWELL region 704 will attract more contaminants than the PWELL region 706. However, given the large, rough backside region 710, the contaminants that remain on the front side 712 are generally small in number.

Figure 7B:
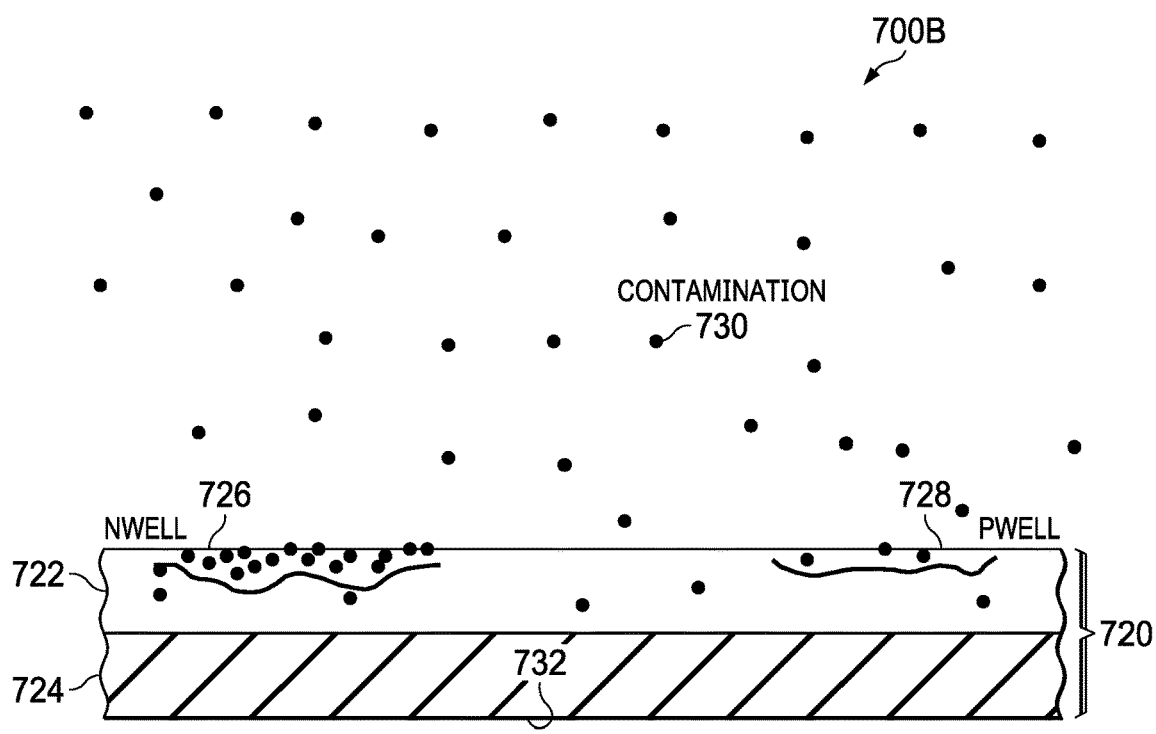
FIG. 7B depicts an IC fabricated using an SOI substrate and demonstrates a typical distribution of generated contaminants.

FIG. 7B depicts a simplified schematic of an IC 700B that is being fabricated on an SOI substrate 720. SOI substrates contain a thin, dielectric layer, such as silicon oxide or glass, between a thin top layer of a semiconductor material such as silicon and a supporting handle portion that is also a semiconductor. The SOI substrate 720 includes a silicon surface layer 722 over a buried oxide layer 724 or other insulator layer, while a handle wafer below the buried oxide is not specifically shown. An NWELL region 726 and a PWELL region 728 have been formed, either by implantation or diffusion. As contaminants 730 are formed, these contaminants again tend to settle on or move to the roughest areas of the SOI substrate 720. Because of the additional processing of the SOI substrate 720, the backside region 732 is sealed by oxide or much smoother than the backside region 710 of the bulk silicon substrate 702. Instead of migrating to the backside region 732, the contaminants 730 tend to migrate to the NWELL region 726, while the PWELL region 728 generally receives a lesser amount of contaminants since an NWELL silicon surface is much more distressed or rougher compared to a PWELL silicon surface due to phosphorus and/or arsenic implants.

Figure 8:
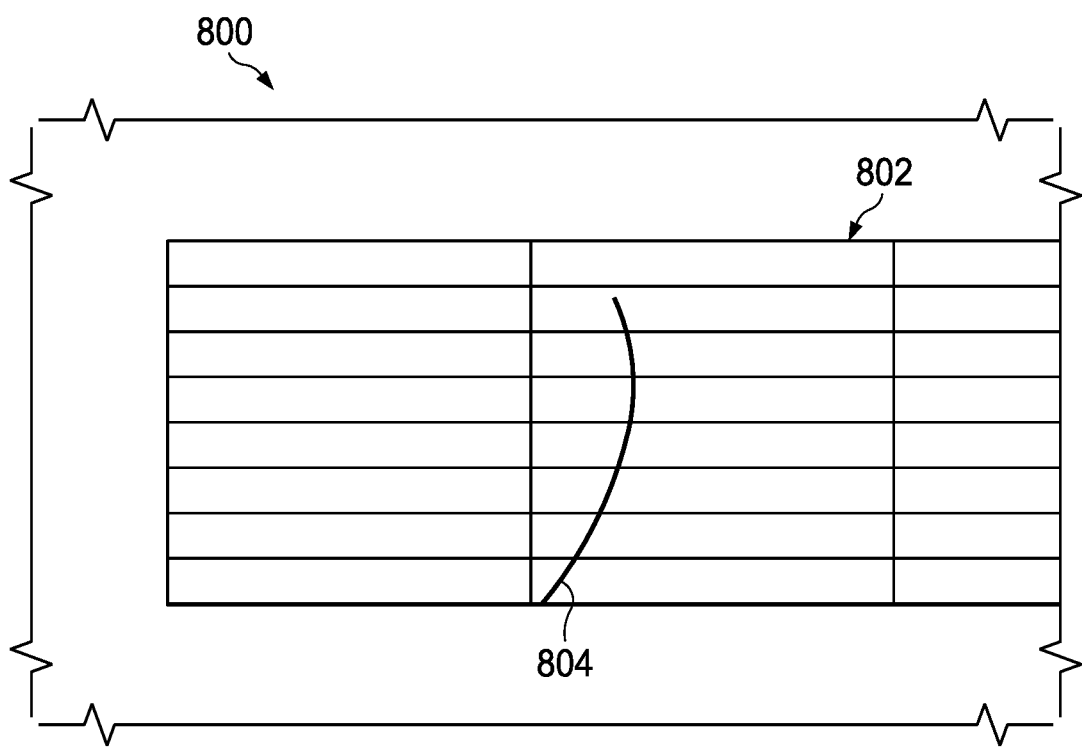
FIG. 8 depicts a "worm" line defect caused by contaminant migration in an oxide layer.

When contaminants are found in an NWELL region that is covered by an oxide and a polysilicon plate, e.g. in a capacitor or other electronic device, a potential exists for the oxide to be damaged, especially when a bias is placed across the oxide, e.g., during operation. The present application uses capacitors in the example implementations, because capacitors may be the most vulnerable devices due to their generally smaller size, although other electronic devices may also be affected. FIG. 8 depicts an IC 800 containing a capacitor array 802. A contaminant (not specifically shown) has encountered the capacitor array 802 and has forged a path or "worm" line 804 across a number of the capacitor oxides, which renders the respective capacitors unusable. This type of failure tends to originate at an edge of the capacitor array 802 that faces towards "white" space in the chip. For purposes of this application, the white space is simply regions of the chip that do not have devices fabricated thereon. Such white space may be part of a PWELL region, which is much less attractive to the contaminants than an NWELL region. As noted previously, when contaminants land on the PWELL region, the contaminants tend to migrate through the silicon until the contaminants encounter a rougher, more favorable region, where they will remain.

Figure 9:
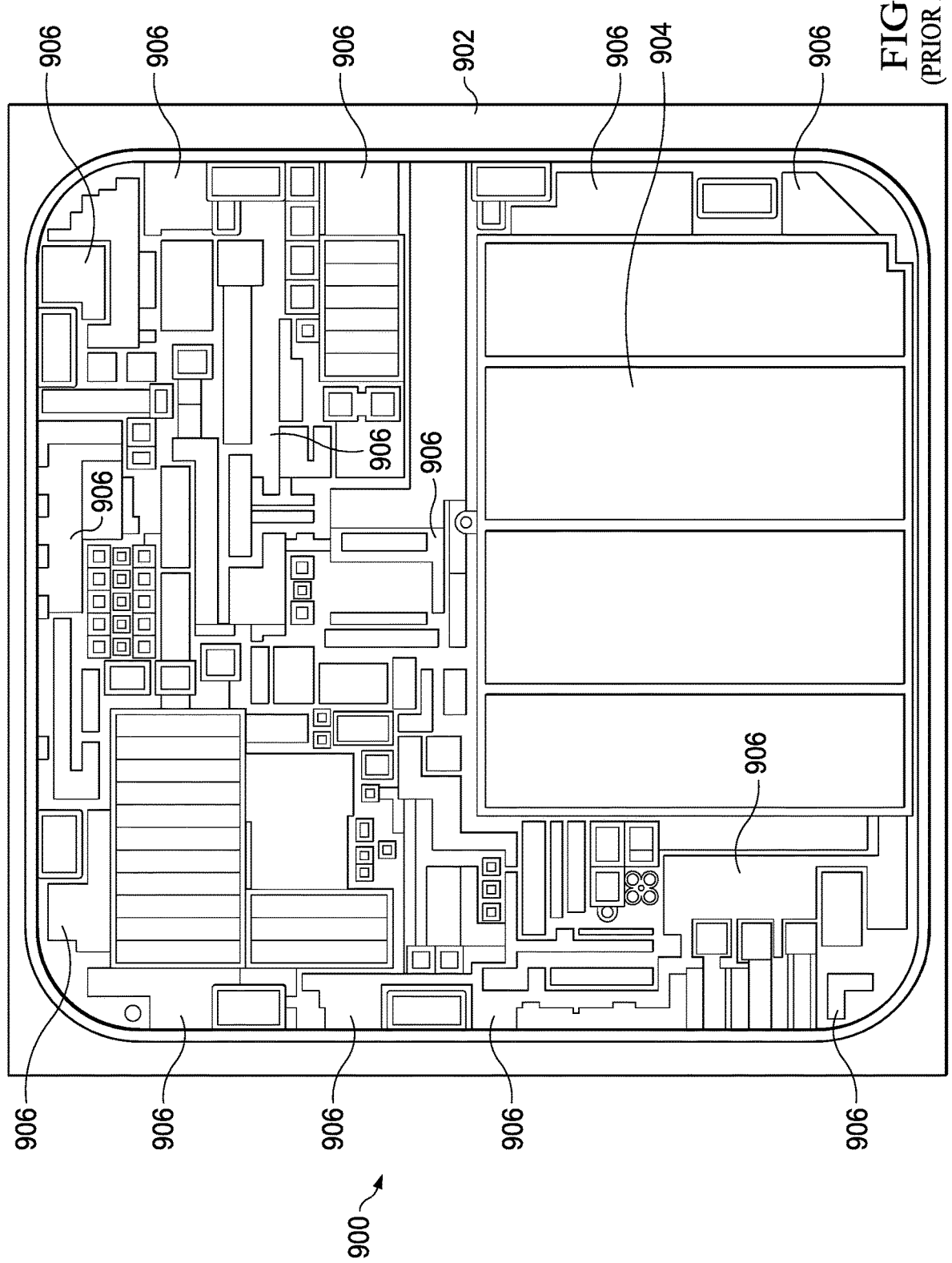
FIG. 9 depicts an IC fabricated on an SOI substrate that contains a large amount of getter space according to the prior art.

FIG. 9 depicts a plan view of a prior art IC 900 that contains devices fabricated on an SOI substrate 902. Seen in the IC 900 are NWELL regions 904 and getter regions 906. The getter regions 906 appear across the SOI substrate 902, but are concentrated near the edges of the layout. The getter regions 906 are formed by implanting large molecules such as phosphorus or arsenic with high doses that produce a roughened surface to attract and hold the contaminants. In one implementation, the large molecule may be phosphoryl chloride, $POCl_3$, which is commonly called phosphorus oxychloride. Fabrication of the getter regions 906 requires a separate mask through which the $POCl_3$ may be implanted. In one implementation, the phosphorus oxychloride is implanted at a dose equal to or greater than 4E15 $cm^{-2}$ and energy of 100 keV. In testing performed using the then new getter regions 906, a determination was made that if the getter regions occupied less than five percent (5%) of the chip area, gate oxide integrity (GOI) errors increased significantly, but that getter regions occupying more than 5% had very few GOI errors. Once the getter regions 906 went into production, however, it was determined that the actual percentage of the SOI substrate 902 that needed to be devoted to the getter regions 906 was about fifteen percent (15%). It would be desirable to find a solution that did not require a separate mask for contaminant collection and/or that needed no dedicated collection regions.

Several lessons have been learned from the previous dedicated getter. For example, in semiconductors, the sheet resistance appears to be inversely proportional to the roughness of the surface of an associated region, so that the lower the sheet resistance of a region, the more attractive that region is to contaminants. With a sheet resistance that may be in the single digits, e.g., about 6 Ω/square, the dedicated getter regions 906 attract most of the contaminants that landed on the SOI wafer. However, this attraction comes with additional costs. The level of dopants is so high that when the wafer is subjected to high temperatures, the getter dopants may diffuse into surrounding areas, which is termed auto-doping. When auto-doping occurs, the dopant concentration in the surrounding silicon is changed and the electrical characterization of the circuit is also changed. In particular, because the dedicated getter regions cover a large area of the circuit, care must be taken to ensure that the auto-doping doesn't affect surrounding circuits.

Applicants disclose herein two separate methods of providing contaminant protection. Notably, devices that are vulnerable to GOI errors, e.g., capacitors in which an oxide and a polysilicon plate lie over an NWELL, are most vulnerable when the devices have one or more edges that face the white space from which contaminants tend to migrate. The current application focuses on protecting capacitors, although it will be understood that other electronic devices having an oxide and a polysilicon plate over an NWELL are also included. Transistor gates over an NWELL region may attract contaminants, but because of their larger size the gates have more space in which the contaminants may be dispersed or averaged out. Capacitors that are surrounded by other devices having an NWELL do not generally suffer from GOI errors, but when one or more edge of the capacitors are adjacent to white space, the incidence of errors increases.

Both of the disclosed methods use existing fabrication processes to create new contaminant collection/retention regions and no additional masks are necessary, although modifications may be needed to existing masks. A first device and method includes sacrificial NWELL rings that are fabricated between the white space and the vulnerable capacitors. Rather than attempting to collect all of the contaminants that fall on the silicon, the sacrificial NWELL rings provide localized protection in those regions that most need the protection. A second device and method transform the white space by providing a contaminant locker region near the surface of the white space that has a sheet resistance lower than the sheet resistance of the NWELL regions. The white space then becomes more attractive and will hold onto the contaminants rather than allowing the contaminants to migrate elsewhere. The transformed white space does not seek to attract all of the contaminants that fall on the wafer, but to retain the contaminants that fall on the white space so that these contaminants do not flood into the regions where the capacitors are exposed to the white space. As such, the DWELL region, which uses a much smaller molecule than the $POCl_3$ molecules but a highly energetic and high dose implantation process, creates a lower sheet resistance and roughens the surface sufficiently to hold onto contaminants rather than allowing the contaminants to migrate.

Sacrificial NWELL Rings

Figure 1:
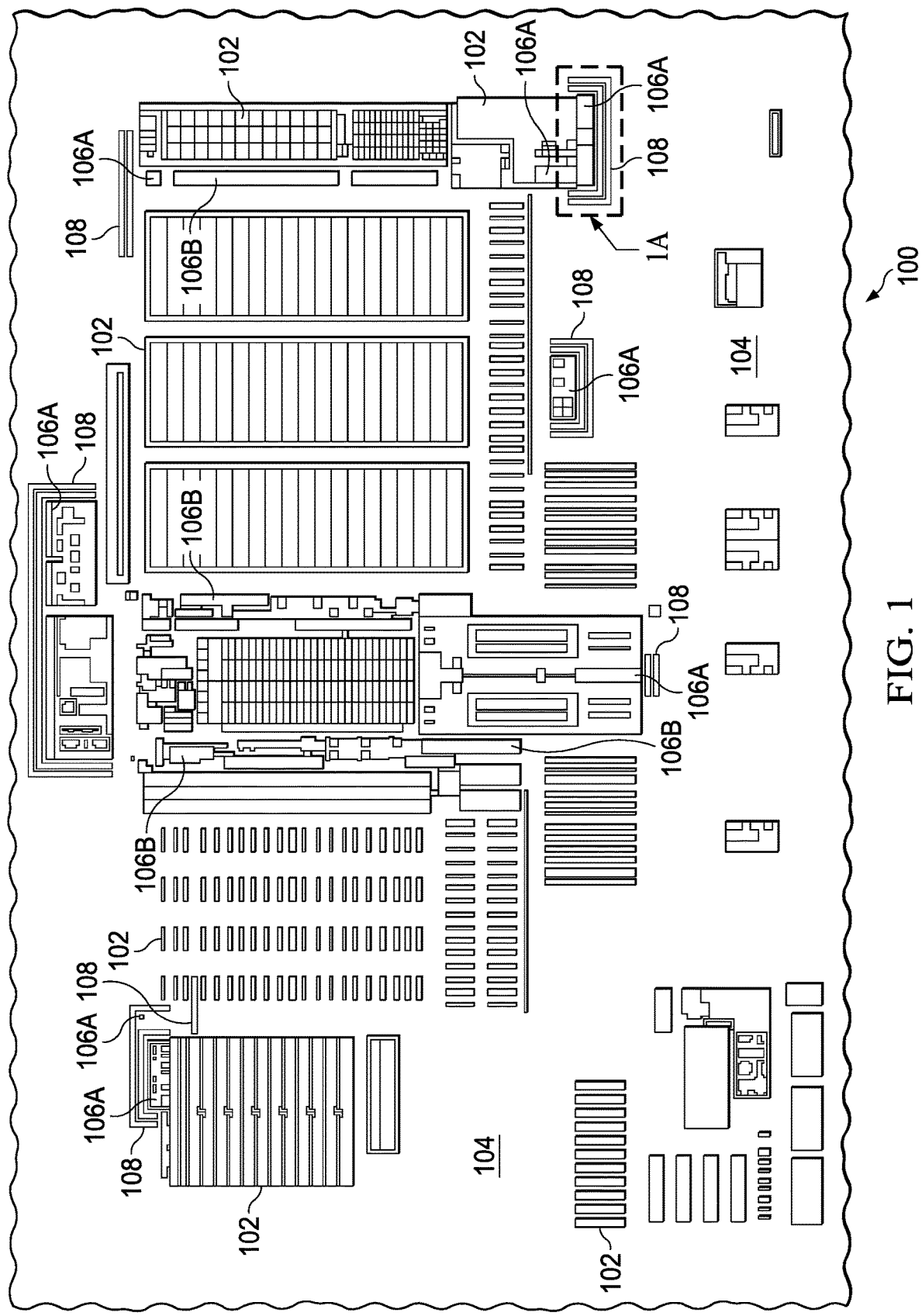
FIG. 1 depicts a plan view of an example IC fabricated on an SOI substrate according to an implementation of the disclosure.

FIG. 1 depicts a plan view of an example integrated circuit 100 that can be fabricated on an SOI substrate. Illustrated in the integrated circuit 100 are NWELL regions 102, which form a large percentage of the illustrated regions. The NWELL regions 102 are surrounded by white space regions 104 in which no devices are formed. The white space regions 104 in this implementation includes a PWELL containing, e.g, boron and may also be referred to as PWELL regions 104, although additional PWELL regions may form part of various devices. The white space regions 104 can be a large source of contaminants, simply because of the area of the white space regions 104 and the fact that the associated PWELL dopant level is low, so that contaminants that land on the white space regions 104 tend to migrate towards more attractive regions nearby.

Capacitor regions 106 are found at a number of locations across the integrated circuit 100 and may include both first capacitor regions 106A, which are adjacent the white space regions 104 on one or multiple sides, and second capacitor regions 106B, which are located in the midst of NWELL regions 102. The second capacitor regions 106B, because they are surrounded by NWELL regions 102, rarely encounter GOI failures because any contaminants in the region will be shared relatively equally across the NWELL regions 102. The first capacitor regions 106A are more vulnerable due to proximity to the large white space regions 104 and sacrificial NWELL rings 108 have been provided between the first capacitor regions 106A and the white space regions 104 to provide localized collection of contaminants.

The use of the term NWELL "rings" is not meant to imply that these rings are circular or that a sacrificial NWELL ring 108 necessarily forms a closed structure surrounding a protected device. For purposes of the present application, a sacrificial NWELL ring 108 is simply an NWELL region that is formed between a device to be protected, e.g., a first capacitor region 106A, and the white space regions 104 where no active devices—especially no active NWELL regions—are present. Because the need for protection from contaminants for the first capacitor regions 106A varies in different locations, the shape of the sacrificial NWELL rings 108 will also vary. At some locations, only one side of the first capacitor region 106A is adjacent the white space regions 104. At these locations, a sacrificial NWELL ring 108 may form a linear NWELL "ring" that is not part of an active device. Several examples of the linear sacrificial NWELL rings 108 are shown. Other locations may have first capacitor regions 106A that are exposed to the white space on two, three, or four sides of the first capacitor. At these locations, the sacrificial NWELL rings 108 may have a corresponding "L" shape when two sides of the capacitor are exposed to the white space, a "U" shape when three sides of the capacitor are exposed to the white space, and a closed shape, e.g., a hollow square, when the first capacitor region 106A is open to white space on four sides. Because these are "sacrificial" NWELL regions, the area over the sacrificial NWELL rings 108 may not be used for any active devices and thus may not have an oxide and polysilicon plate formed over the sacrificial NWELL rings 108.

Figure 1A:
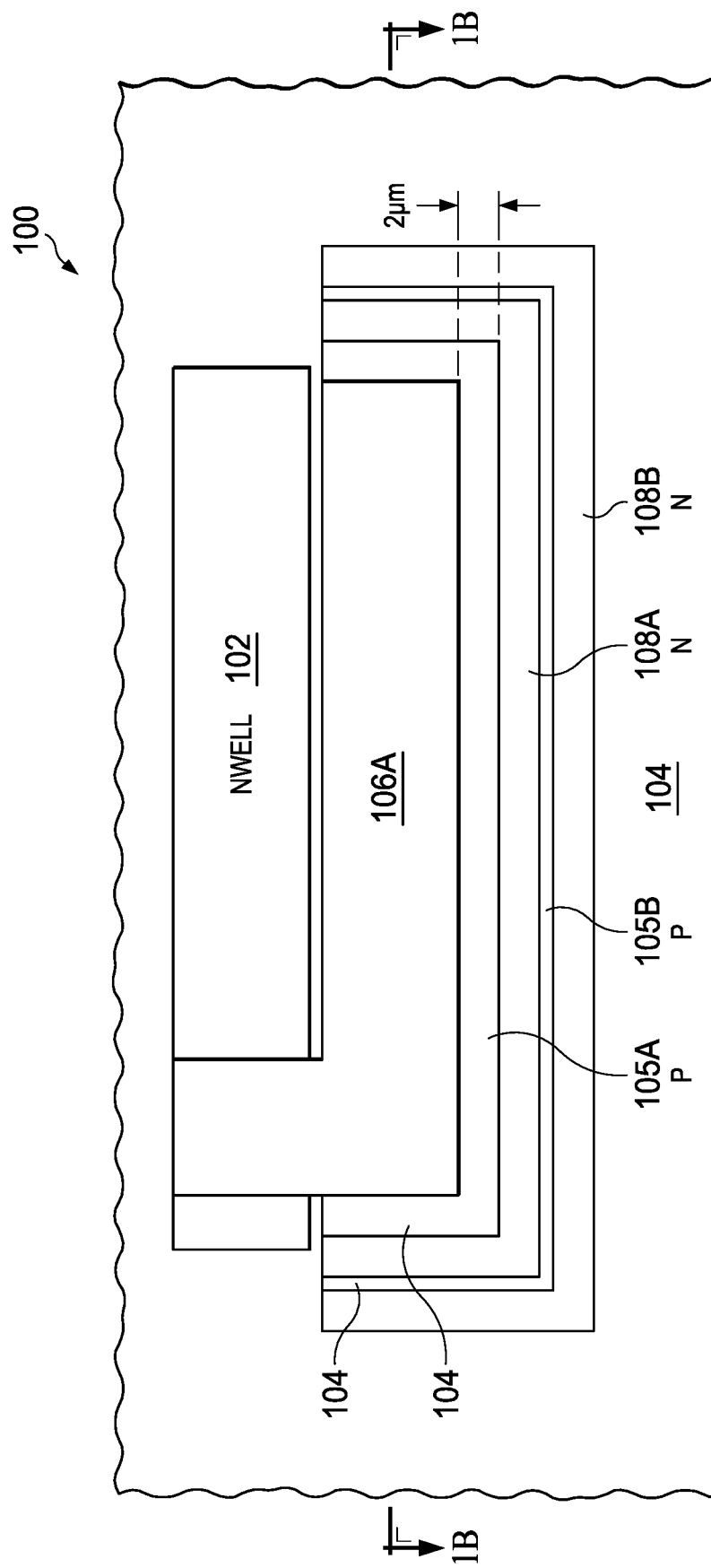
FIG. 1A depicts a close-up plan view of an example sacrificial NWELL ring for a vulnerable capacitor.

FIG. 1A depicts an enlarged view of a first capacitor region 106A and the sacrificial NWELL rings 108 of the integrated circuit 100; this region is circled in FIG. 1. Although the first capacitor region 106A is shown as a solid figure, this is not meant to imply that the entire region enclosed by the first capacitor region 106A is necessarily all capacitors. Rather, the first capacitor region 106A represents a region that needs to be protected because of the presence of a number of vulnerable capacitors. Similarly, the NWELL region 102 that is near the first capacitor region 106A may not be a solid NWELL region, but indicates the presence of enough NWELLs that this region protects one side of the first capacitor region 106A, while the white space regions 104 surrounds the remaining three sides of the first capacitor region 106A.

The sacrificial NWELL rings 108 are shown here as a first sacrificial NWELL ring 108A and a second sacrificial NWELL ring 108B. An implementation of the sacrificial NWELL rings 108 is described herein, but these are provided as examples only and are not intended as limitations. In the implementation shown, the first sacrificial NWELL ring 108A is spaced apart from the first capacitor region 106A by a distance of about 2 μm to form a first gap 105A that discourages migration of contaminants from the first sacrificial NWELL ring 108A to the first capacitor region 106A. The first gap 105A is a part of the white space regions 104 and while no active devices may be formed over the first gap 105A, an STI structure may be formed over the first gap 105A. Each of the first sacrificial NWELL ring 108A and the second sacrificial NWELL ring 108B may have a width of about 2 μm, with a second gap 105B of about 0.5 μm between the first and second sacrificial NWELL rings 108A and 108B. A gap of about 0.5 μm between the sacrificial NWELL rings 108 and the NWELL regions 102 may also be provided wherever the two regions are adjacent each other. When discussing widths, the term "about" means ±10%. It was initially thought that the sacrificial NWELL rings 108 and the NWELL regions 102 need to connect with each other so that the sacrificial NWELL rings 108 were not floating. It was later determined that while the connection could be provided, such a connection was not necessary.

Figure 1B:
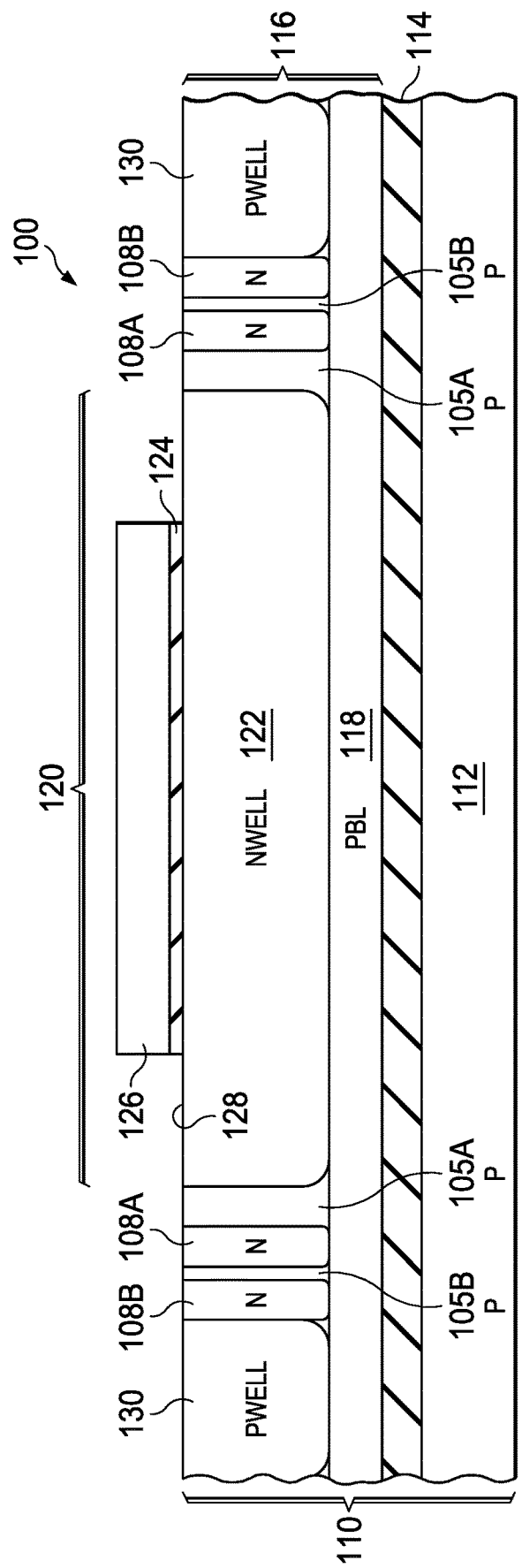
FIG. 1B depicts a cross-section of a portion of the capacitor and sacrificial NWELL ring of FIG. 1A.

FIG. 1B depicts a cross-sectional view of the integrated circuit 100 of FIG. 1A that is taken along line 1B-1B. Although the first capacitor region 106A (FIG. 1A) may be formed of a number of devices that include capacitors, a single capacitor 120 is shown in this cross-sectional view for purposes of explanation and simplicity. The integrated circuit 100 is on an SOI substrate 110, which includes a handle wafer 112, a buried insulator layer 114, and a semiconductor layer 116. In one implementation discussed herein, the buried insulator layer is a buried oxide layer 114 and the semiconductor layer is a silicon layer 116, which may include an epitaxial layer (not explicitly shown). A P-type buried layer (PBL) 118 lies directly over the buried oxide layer 114.

The capacitor 120 includes an NWELL region 122, a dielectric 124, and a polysilicon plate 126 or other semiconductor plate 126. The NWELL region 122 extends from a surface 128 of the silicon layer 116 to the PBL 118. The dielectric 124, which may be an oxide, lies on the surface 128 of the silicon layer 116 over the NWELL region 122 and the polysilicon structure 126 lies on the dielectric 124. A PWELL region 130 can be seen at either end of the NWELL region 122. In the implementation shown, the PWELL region 130 forms a part of the white space regions 104 seen in FIG. 1 and FIG. 1A. To protect the NWELL region 122, a first sacrificial NWELL ring 108A and a second sacrificial NWELL ring 108B have been formed between the NWELL region 122 and the PWELL region 130. The first sacrificial NWELL ring 108A is separated from the NWELL region 122 by a first gap 105A and is separated from the second sacrificial NWELL ring 108B by a second gap 105B. Both the first gap 105A and the second gap 105B carry the same doping as the PWELL region 130 and discourage the migration of contaminants towards the NWELL region 122.

FIGS. 2A-2E each depicts a cross-sectional view at a stage 201 in the fabrication of an IC 200 according to an implementation of the disclosure. These drawings will be discussed with regard to FIG. 3, which depicts a flowchart for a method 300 of fabricating an IC according to one implementation. Method 300 begins with providing an SOI substrate having a silicon layer over an oxide layer (305). Although the present application discusses silicon as the semiconductor material and an oxide as the dielectric layer in an SOI substrate, the SOI substrate may use other semiconductor materials and other dielectric materials, e.g., gallium nitride, silicon carbide, etc. for semiconductors and nitrides, aluminum oxide, sapphire, glass, etc. for dielectrics. A first side of the substrate will be used for the fabrication of electronic devices, while a second side may be considered a handle wafer.

A PBL may be formed in the silicon layer on the first side of the SOI substrate (310). In one implementation, the PBL may be formed by deposition of a P-type dopant, which may be boron, on a surface of the silicon layer prior to the fabrication of an epitaxial layer. As the epitaxial layer is deposited or grown, the P-type dopant diffuses into both the silicon layer and the epitaxial layer, forming the P-type buried layer. The buried layer may also be fabricated using an energetic implantation of the P-type dopant. The PBL may be a blanket layer or may be a partial layer. NWELL regions and sacrificial NWELL rings may be formed in the silicon layer (315). The sacrificial NWELL ring is on a first side of the NWELL region and separated from the NWELL region by a first gap.

Figure 2A:
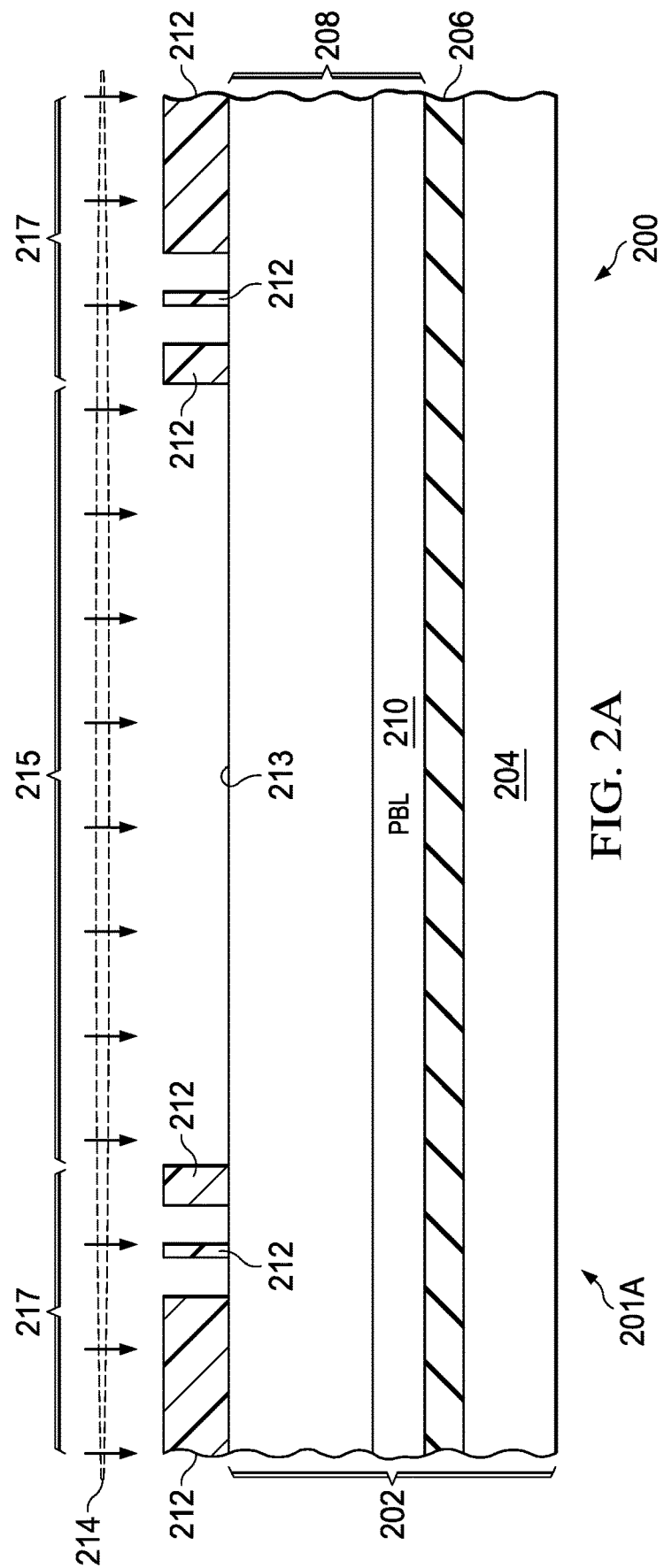
FIGS. 2A-2D depict various stages in the fabrication of an IC according to an implementation of the disclosure.
Figure 3:
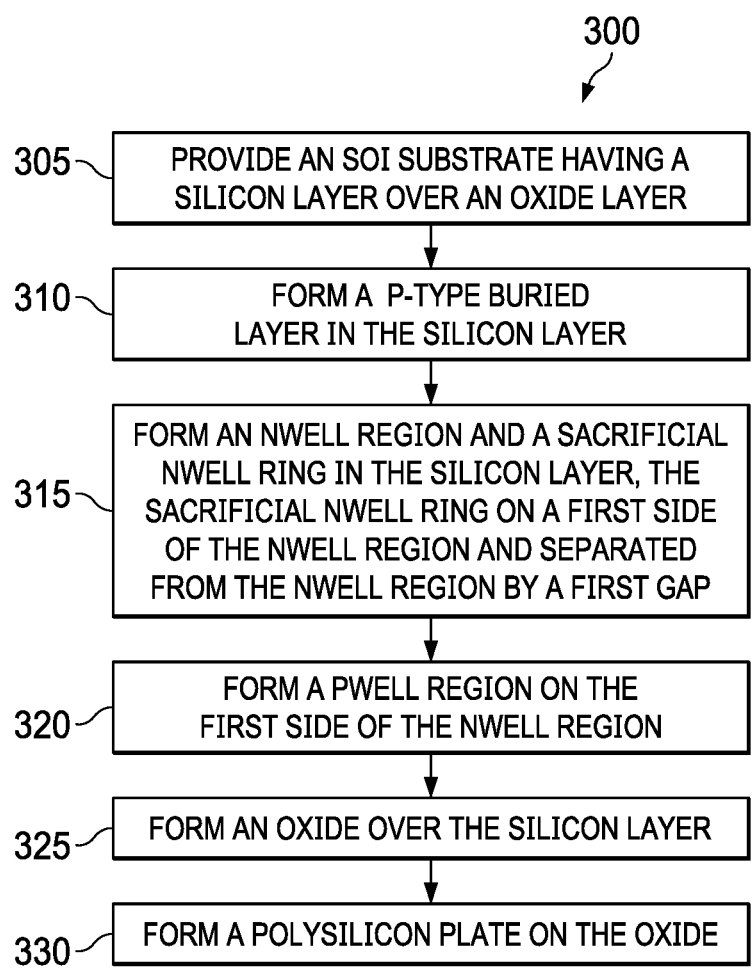
FIG. 3 depicts a method of fabricating the IC of FIG. 2D according to an implementation of the disclosure.

FIG. 2A depicts an IC 200 on which a capacitor 215 that is adjacent white space 217 is being fabricated. The IC 200 is at a stage 201A in which an SOI substrate 202 is provided. The SOI substrate 202 includes a handle wafer 204, a buried oxide layer 206 or other dielectric layer, and a silicon layer 208, which may contain an epitaxial layer (not specifically shown). A PBL 210 has already been formed in the silicon layer 208. In the stage 201A, an NWELL photoresist layer 212 has been deposited, patterned, and etched on a surface 213 of the silicon layer 208 to expose regions where NWELLs are desired, including NWELL rings. The present application is directed to capacitors that have NWELLs, even though other devices, e.g., transistor gates that lie over NWELLs, may also be adjacent white space and have some increased vulnerability. However, such gates tend to be much larger than the capacitors disclosed herein and thus able to spread any additional dose of contaminants over a greater region, thereby lessening the risk of GOI failures. If needed, NWELL rings may also be used with other devices.

The NWELL regions may be provided not only for the capacitor 215, but also for other capacitors, transistors, resistors, etc., which are being formed as part of the IC. As will be clear, the sacrificial NWELL rings are formed at the same time as the other NWELL features. This means that no new masks are necessary to incorporate the sacrificial NWELL rings, although an existing mask may need to be altered when incorporating the sacrificial NWELL rings into an existing fabrication process. An NWELL implantation process 214 is in progress at the stage 201A to implant an N-type dopant, which may be phosphorus, into the exposed regions. In one implementation, the NWELL implantation process will implant phosphorus at a dosage of 2E13 cm$^{-2}$ and an energy of 1.2 MeV. In the context of implant dosages, the term "about" means ±10%. In the context of implant energy, the term "about" means ±10%.

The method 300 may also form PWELL regions on the first side of the NWELL regions (320). Some PWELL regions may form part of active devices, although larger PWELL regions form the white space that may provide contaminants to capacitors. In regions where the sacrificial NWELL rings are used, the PWELL regions of the white space will be adjacent at least one side of an NWELL region that will be part of a capacitor. In some instances, an NWELL region that is destined to be part of a capacitor may have PWELL regions adjacent to two, three, or even four sides of the NWELL region.

Figure 2B:
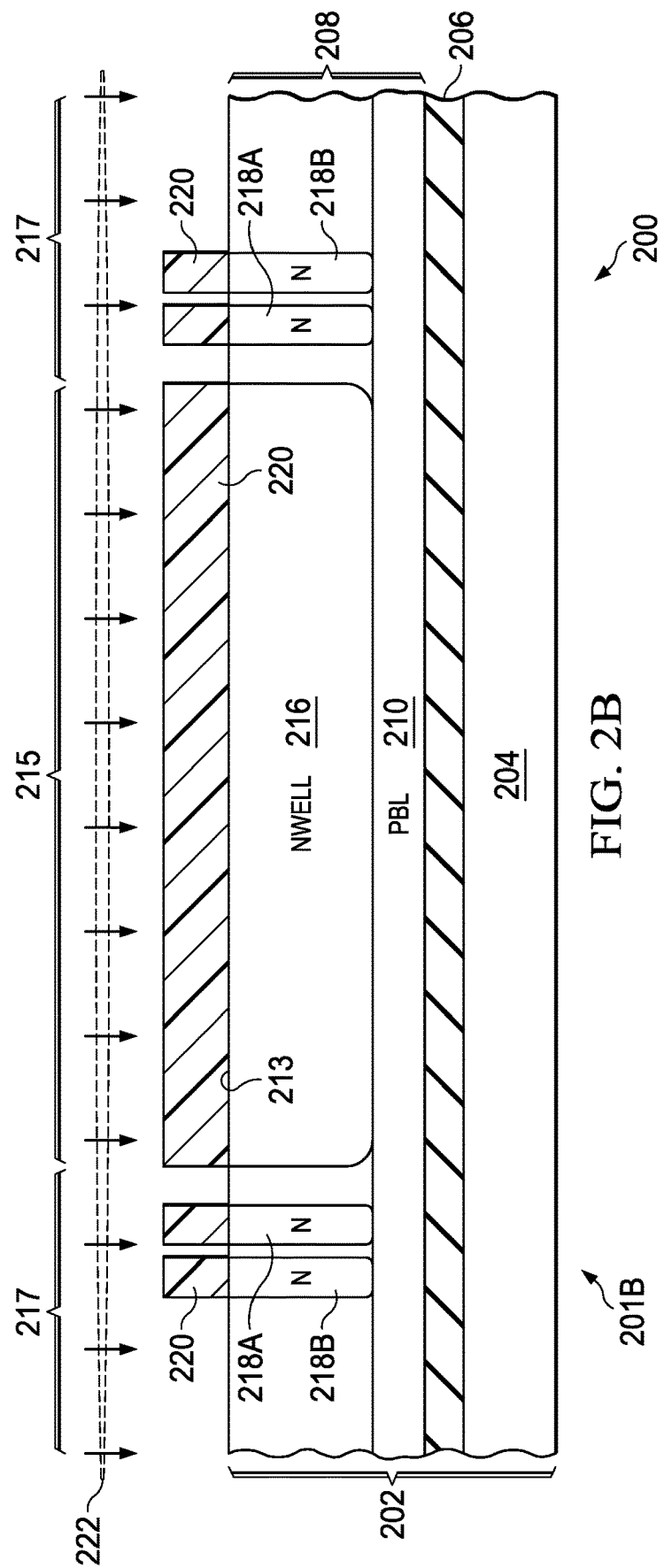

FIG. 2B depicts an IC 200 at a stage 201B in which formation of an NWELL region 216 has been completed, as well as a first sacrificial NWELL ring 218A and a second sacrificial NWELL ring 218B. In one implementation as shown, each of the NWELL region 216, the first sacrificial NWELL ring 218A, and the second sacrificial NWELL ring 218B extend from the surface 213 to the PBL 210. A PWELL photoresist layer 220 has been deposited on the surface 213 of the silicon layer 208, patterned, and etched to expose regions where PWELL regions are desired. A P-type implantation process 222 is being performed to implant a P-type dopant into the exposed regions around the NWELL region 216 and the NWELL rings 218. In one implementation, the P-type implantation process 222 implants boron at a dose of 4E12 cm$^{-2}$ and energy of 500 eV, with a tilt=2, and twist equal to 0, 90, 180, and 270.

Method 300 may continue with formation of an oxide over the surface of the silicon layer and thus over both the PWELL regions and the NWELL regions (325). In one implementation, the oxide is formed as part of a gate oxide formation process. In one implementation, the oxide is grown using thermal oxidation, although the oxide may also be deposited. Formation of the oxide may be followed by forming a polysilicon plate on the oxide (330). In one implementation, the polysilicon plate may be formed by depositing a polysilicon layer over the surface of the IC. A photoresist layer, e.g., a gate photoresist layer, is deposited and patterned and an etch process is performed. The photoresist layer protects those regions where polysilicon structures are desired, e.g., as gates and capacitor upper plates, while exposing other regions of the polysilicon layer to the etch process.

Figure 2C:
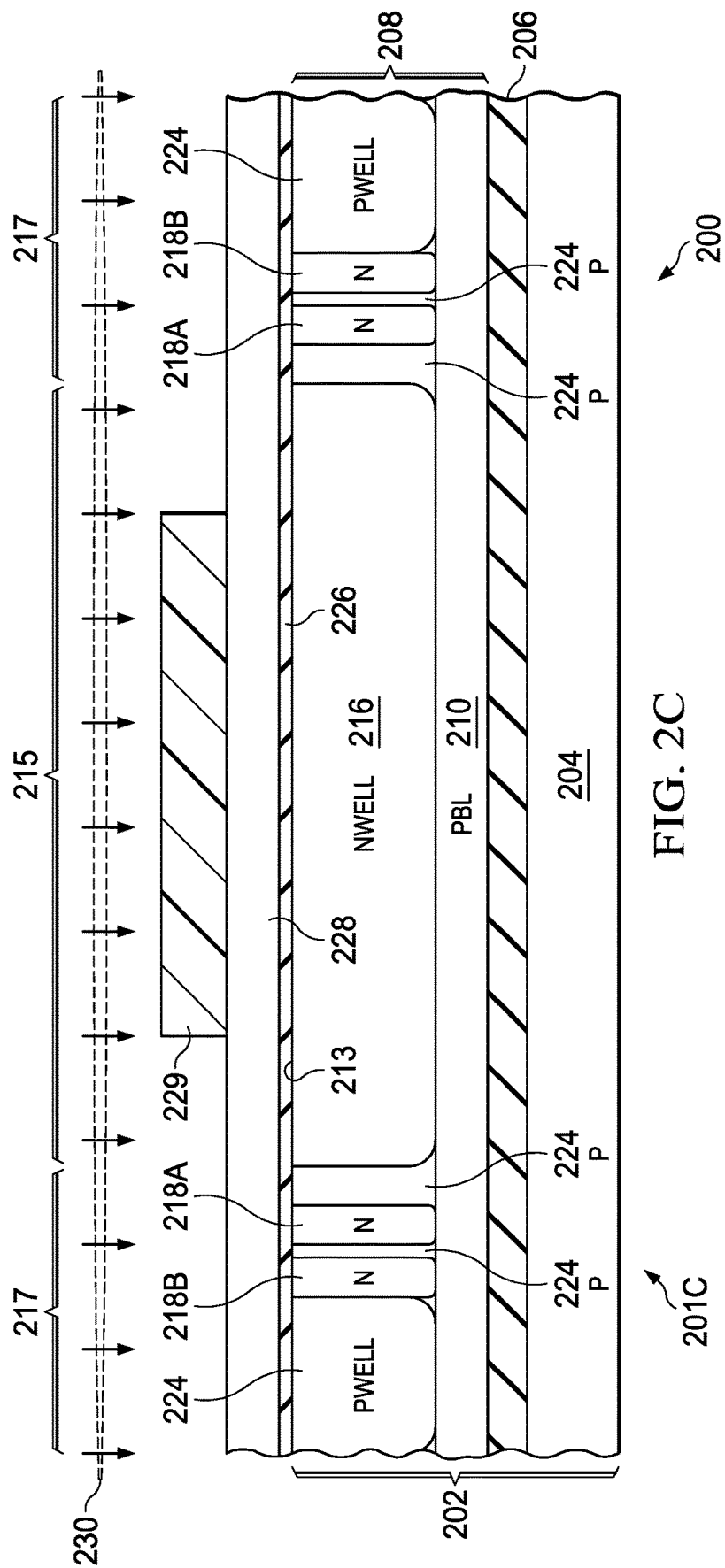

FIG. 2C depicts an IC 200 at a stage 201C in which formation of a PWELL region 224 has been completed, including the regions between the sacrificial NWELL rings 218 and between the first sacrificial NWELL ring 218 and the NWELL region 216. In one implementation, each section of the PWELL region 224 extends from the surface 213 to the PBL 210. As seen in the stage 201C, a dielectric layer 226, which may be an oxide, has been fabricated on the surface 213 of the silicon layer 208 and a polysilicon layer 228 has been deposited over the dielectric layer 226. A photoresist layer, e.g., a gate photoresist layer 229 has been deposited over the polysilicon layer 228 and has been patterned and etched to cover the regions for polysilicon structures such as gates and capacitor plates. The stage 201C depicts the gate photoresist layer 229 as covering a region where an upper plate for a capacitor 215 is desired, but exposing other regions. An etch process 230 is in progress to remove the polysilicon layer 228 in the exposed regions.

Figure 2D:
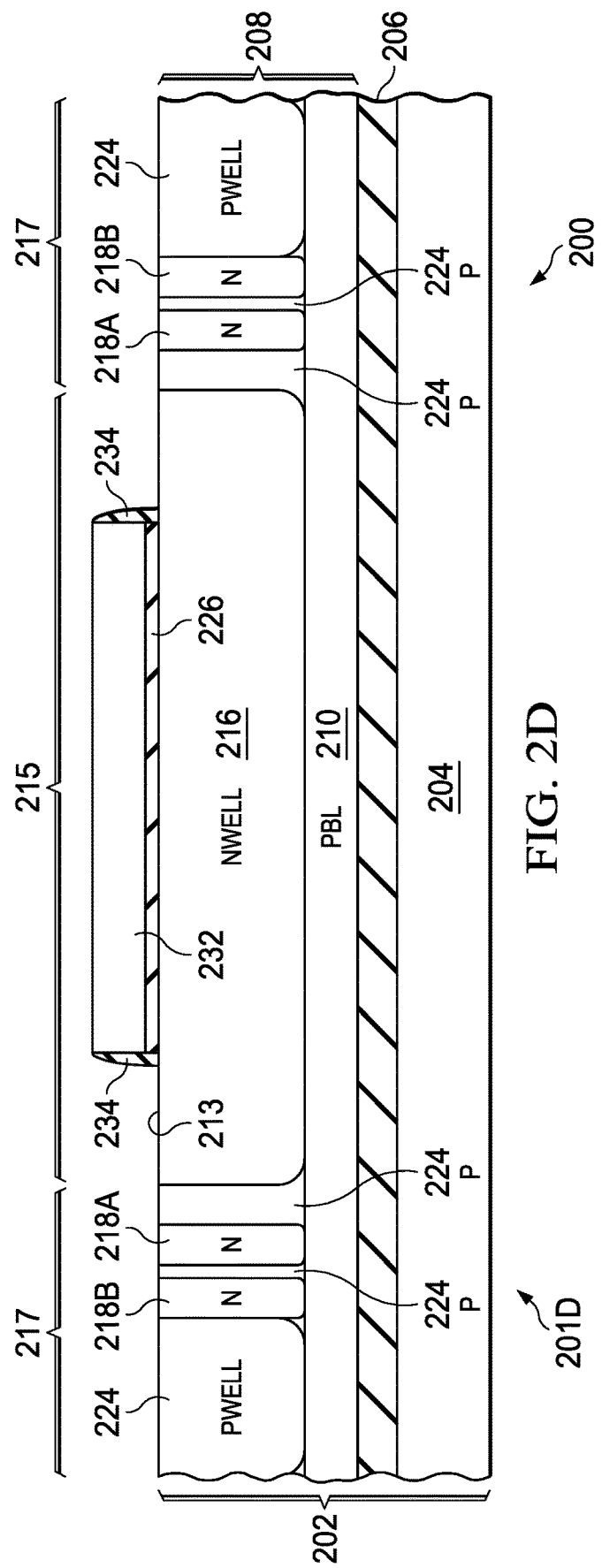

FIG. 2D depicts the IC 200 at a stage 201D after the etch process 230 has been completed and a polysilicon plate 232 has been formed for capacitor 215. In addition to the fabrication of the polysilicon plate 232, sidewall spacers 234 may be formed on the sides of the polysilicon plate 232, e.g., by the deposition of a dielectric layer (not shown), which may be an oxide, and a blanket etch that removes the dielectric layer except where structures such as the polysilicon plate 232 shelters a portion of the dielectric layer.

Contaminant Locker

Figure 4:
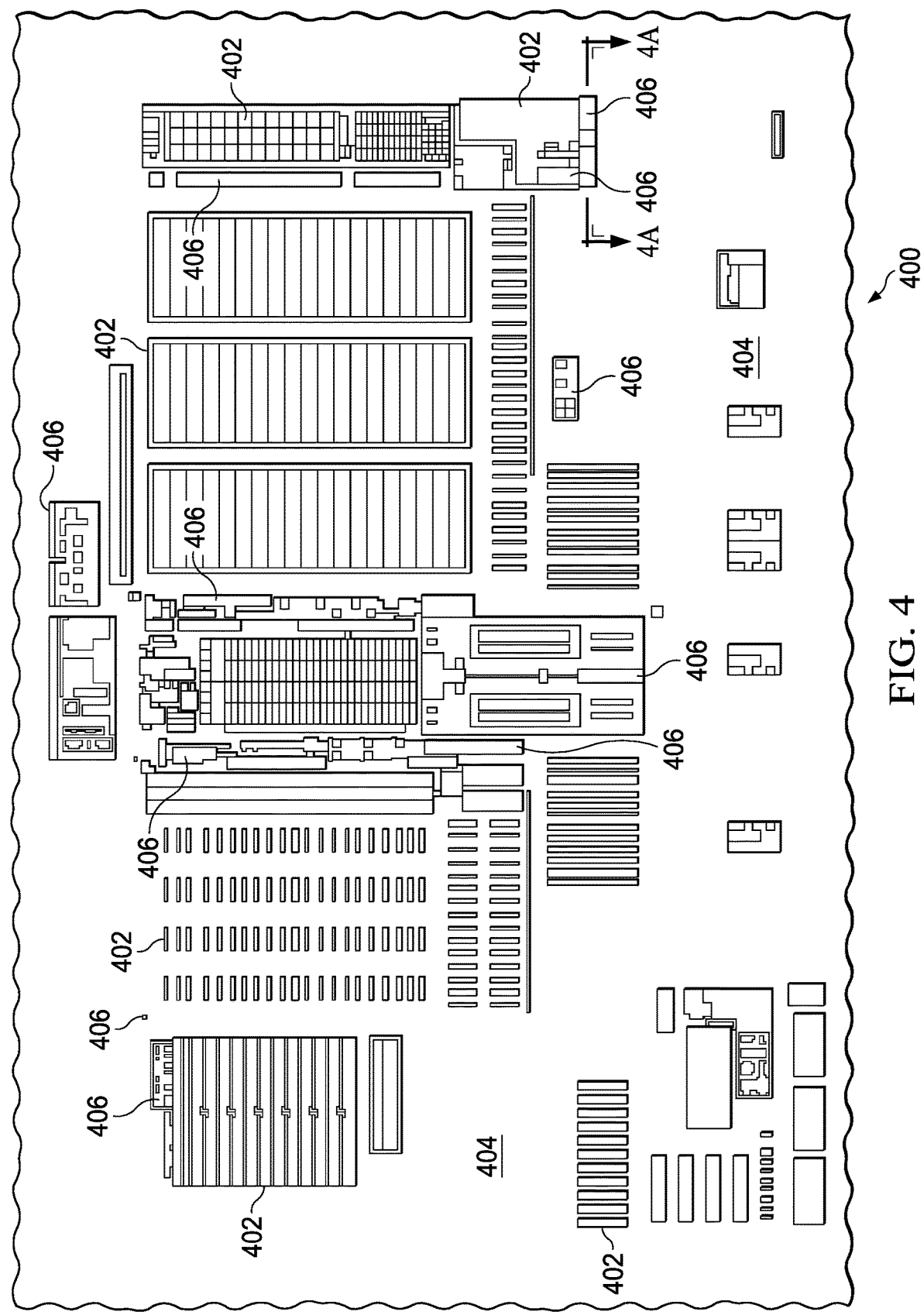
FIG. 4 depicts a plan view of an example IC fabricated on an SOI substrate according to an implementation of the disclosure.

FIG. 4 depicts a plan view of an IC 400 that contains all of the elements shown in FIG. 1 with the exception of the localized protection provided by sacrificial NWELL rings. Instead, the IC 400 relies on a white space region 404 containing a new layer that will be fabricated to provide a roughened P-type region that will lock up contaminants landing thereon, so that the contaminants don't migrate to NWELL regions and cause GOI failures. As disclosed herein, this new layer in the white space is a DWELL layer, which may have a dosage that is an order of magnitude higher than the PWELL layer that has been used, but is also implanted at an energy that is much greater than the energy used to implant the PWELL layer. This additional dosage and energy have been shown to form a contaminant "locker" that will retain the contaminants that are collected thereon. However, it can be noted that rather than providing a region that is damaged to an extent that the region attracts most of the contaminants on the SOI wafer, as the previous getter region does, the added DWELL layer in the white space region 404 simply holds the contaminants that fall on the white space, allowing other regions to deal with a more evenly spread load of contaminants.

It should be noted that other processes may use a somewhat different layer to provide the same benefit. In the disclosed implementation, the DWELL implantation is selected to form the contaminant lockers because this implantation creates a sheet resistance that is lower than the sheet resistance of the NWELLs where the GOI failures are seen. The sheet resistance may provide a rough measurement of the surface damage experienced during the implantation process and thus the "attractiveness" of the region. By providing a white space that has a greater roughness than the NWELL regions, devices formed on the NWELL regions will need to deal with fewer contaminants than previously.

The IC 400 depicts NWELL regions 402, white space region 404, and capacitor regions 406. Because the protection from contaminants in the IC 400 is not localized, no distinction is made in this figure between more susceptible capacitor regions and less susceptible capacitor. However, a capacitor region 406 is indicated in IC 400 that is similarly placed to the circled first capacitor region 106A of FIG. 1 and a cross-section is shown in FIG. 4A.

Figure 4A:
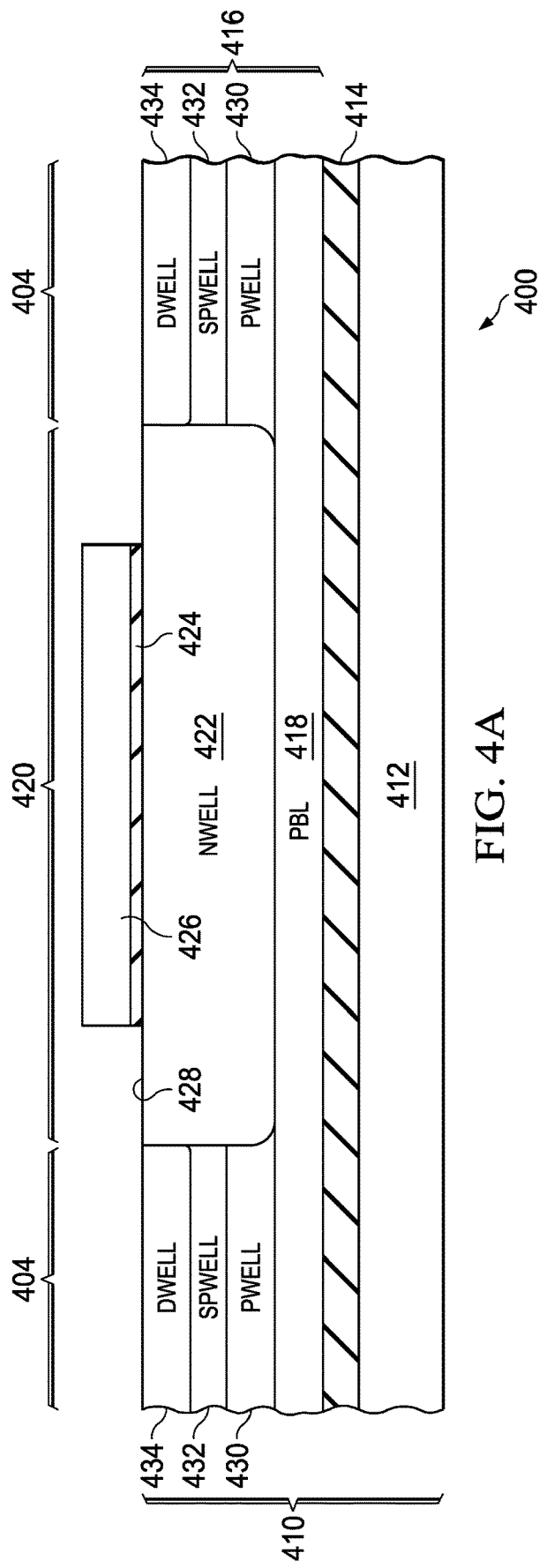
FIG. 4A depicts a cross-section of a capacitor and surrounding white space taken through the line 4A-4A of FIG. 4.

FIG. 4A depicts a cross-sectional view of the integrated circuit 400 as taken through line 4A-4A of FIG. 4. The IC 400 can be seen to be built on an SOI substrate 410, which includes a handle wafer 412, a buried insulator layer 414, and a semiconductor layer 416. In one implementation that is disclosed herein, the buried insulator layer 414 is a buried oxide layer 414 and the semiconductor layer 416 is a silicon layer 416, which may include an epitaxial layer (not explicitly shown). A P-type buried layer (PBL) 418 lies directly over the buried oxide layer 414. Although the capacitor region 406 may be formed of a number of devices that include capacitors, a single capacitor 420 is again shown in this cross-section for purposes of explanation and simplicity.

The capacitor 420 includes an NWELL region 422, a dielectric 424, and a polysilicon plate 426. The NWELL region 422 may extend from a surface 428 of the silicon layer 416 to the PBL 418. The dielectric 424, which may be an oxide, lies on the surface 428 of the silicon layer 416 over the NWELL region 422 and the polysilicon plate 426 lies on the dielectric 424. In the implementation shown of IC 400, the white space region 404 includes three layers, although it is not necessary to have all three of these layers. Looking from bottom to top, the white space region 404 includes a PWELL region 430, an SPWELL region 432, and a DWELL region 434.

To better understand the present implementation, a number of the regions that are found as part of the normal fabrication process on SOI wafers, e.g., an NWELL region, a PWELL region, an SPWELL region, a DWELL region, and an example getter region that has been a mainstay of SOI fabrication for many years, can be broadly compared. In an example implementation, the NWELL region may contain phosphorus; each of the PWELL region, the SPWELL region, and the DWELL region may contain boron; and the getter region may contain $POCl_3$. The PWELL region may have a sheet resistance that is 4-5 times greater than the sheet resistance of the NWELL region. It is known that a lower sheet resistance generally implies greater damage to the surface of the SOI substrate, which helps explain why the contaminants are more attracted to the more damaged NWELL regions. The SPWELL region may have a sheet resistance in the same range as the PWELL region. The getter region, by contrast, may have a sheet resistance that is several hundred times less than the sheet resistance of the NWELL region, and may have a sheet resistance in the single digits, so that the getter region is highly attractive to the contaminants. In contrast to the getter region, the DWELL region may have a sheet resistance that is less than the sheet resistance of the NWELL region, e.g., by about 100 $\Omega$/square, but not by orders of magnitude less. This means that while the DWELL region has been shown to hold onto the contaminants that land thereon, the DWELL region is not the huge attractant that the getter region has been. In the context of sheet resistance, the term "about" means ±10%.

FIGS. 5A-5E depict various stages in the fabrication of an IC 500 according to one implementation. These drawings will be discussed with regard to FIG. 6, which depicts a flowchart for a method 600 of fabricating an IC according to one implementation of the disclosure. Method 600 begins with providing an SOI substrate having a silicon layer over an oxide layer (605). As noted previously, the present application discusses silicon as the semiconductor material and an oxide as the dielectric layer in an SOI substrate. However, the SOI substrate may use other semiconductor materials and other dielectric materials, e.g., gallium nitride, silicon carbide, etc. for the semiconductor material and nitrides, aluminum oxide, sapphire, glass, etc. for the dielectric. A first side of the wafer will be used for the fabrication of electronic devices, while a second side may be considered a handle wafer.

A PBL may be formed in the silicon layer on the first side of the SOI wafer (610). The PBL may be formed by deposition of the P-type dopant, which may be boron, on a surface of the silicon layer prior to the fabrication of an epitaxial layer. As the epitaxial layer is deposited or grown, the P-type dopant diffuses into both the silicon substrate and the epitaxial layer, forming the P-type buried layer. The buried layer may also be fabricated using an implantation of the P-type dopant. The PBL may be a blanket layer or may be restricted to specific regions through the use of a patterned mask during the deposition/implantation. A first PWELL region may be formed in the silicon layer (615). This first PWELL region may be formed adjacent to the surface of the silicon layer, may have a first sheet resistance, a first dopant dose, and may be a DWELL region.

Figure 5A:
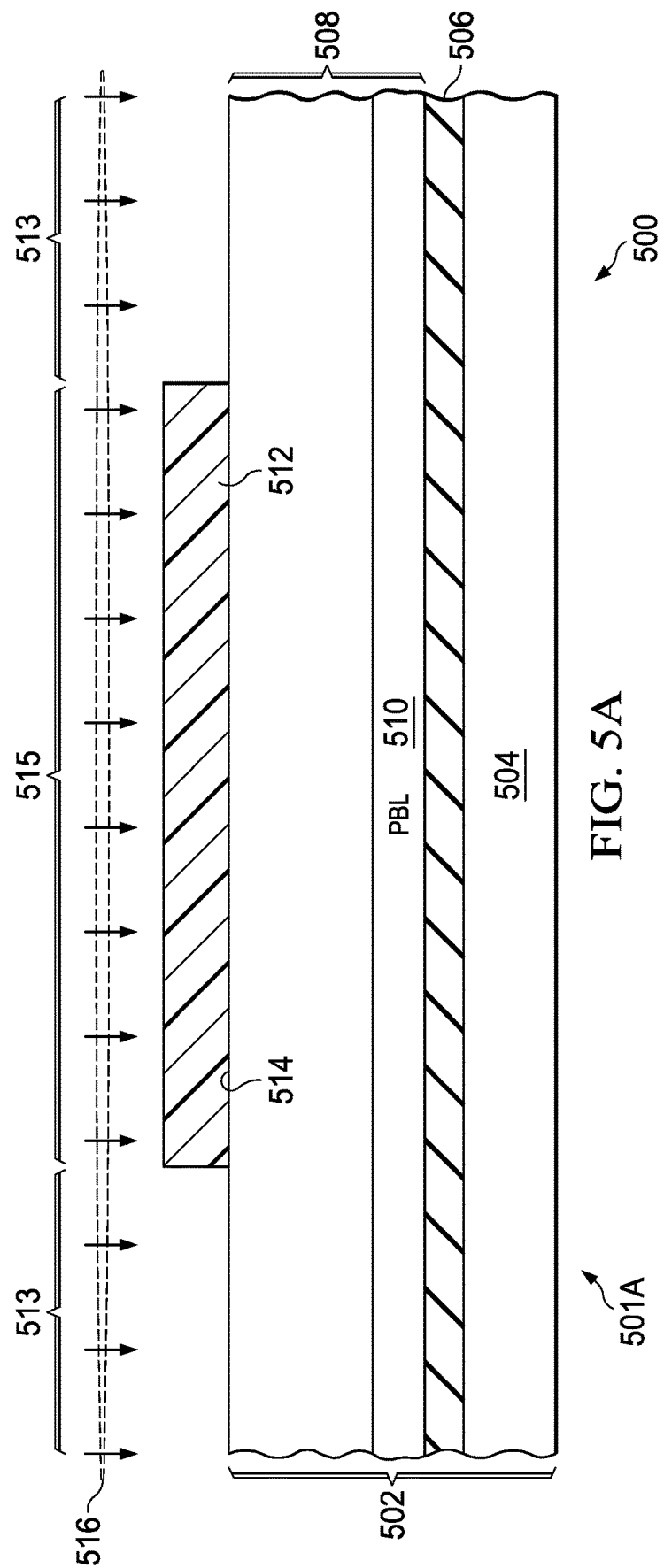
FIGS. 5A-5E depict various stages in the fabrication of an the IC according to an implementation of the disclosure.
Figure 6:
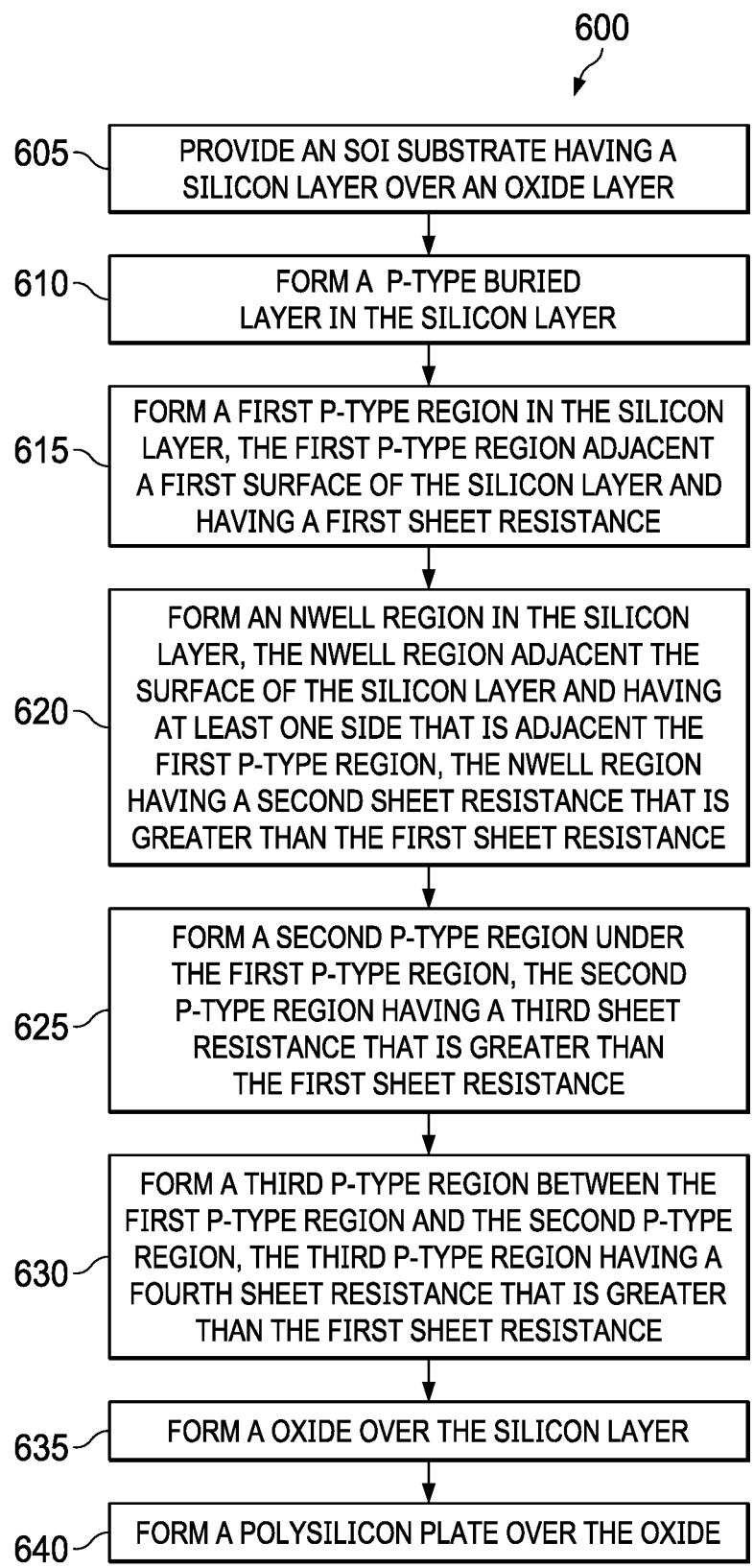
FIG. 6 depicts a method of fabricating the IC of FIG. 5E according to an implementation of the disclosure.

FIG. 5A depicts an IC 500 on which a capacitor 515 that is adjacent to white space region 513 is being fabricated. The IC 500 is at a stage 501A and has an SOI substrate 502 that includes a handle wafer 504, a buried oxide layer 506 or other dielectric layer, and a silicon layer 508 or other semiconductor layer, which may contain an epitaxial layer (not specifically shown). A PBL 510 has been formed in the silicon layer 508.

Stage 501A depicts the IC 500 early in the fabrication of DWELL regions. Although DWELL regions have previously been fabricated in other parts of an IC formed on an SOI wafer and may be part of the normal fabrication process, DWELL regions have not previously been used in the white space where they are now being implemented. In stage 501A, a DWELL photoresist layer 512 has been deposited and patterned on a surface 514 of the silicon layer 508. The DWELL photoresist layer 512 covers the intended NWELL region (not specifically shown) that will be part of the capacitor 515 and exposes the white space region 513. A DWELL implantation process 516 is in progress and will implant a heavy dose of a P-type dopant, e.g., boron, into the silicon layer 508. In one implementation, the DWELL implantation may be a multi-step process that implants boron at different energies; these energies may be in the range of mega-electron volts (MeV). In one implementation, the first dopant dose for the DWELL implant may be up to about $2E14$ $cm^{-2}$ or may be up to ten times the dopant dosage of the NWELL implant. At least one of the boron implantations may use an energy that is greater than the energy used to implant phosphorus in the NWELL region.

The method 600 may also form NWELL regions in the silicon layer (620). The NWELL regions will be adjacent the surface of the silicon layer and have a second sheet resistance that is greater than the first sheet resistance and a second dopant dosage that is less than the first dopant dose. In the current implementation, at least one side of the NWELL region is adjacent the first P-type region, although multiple sides of the NWELL region may be adjacent the first P-type region.

Figure 5B:
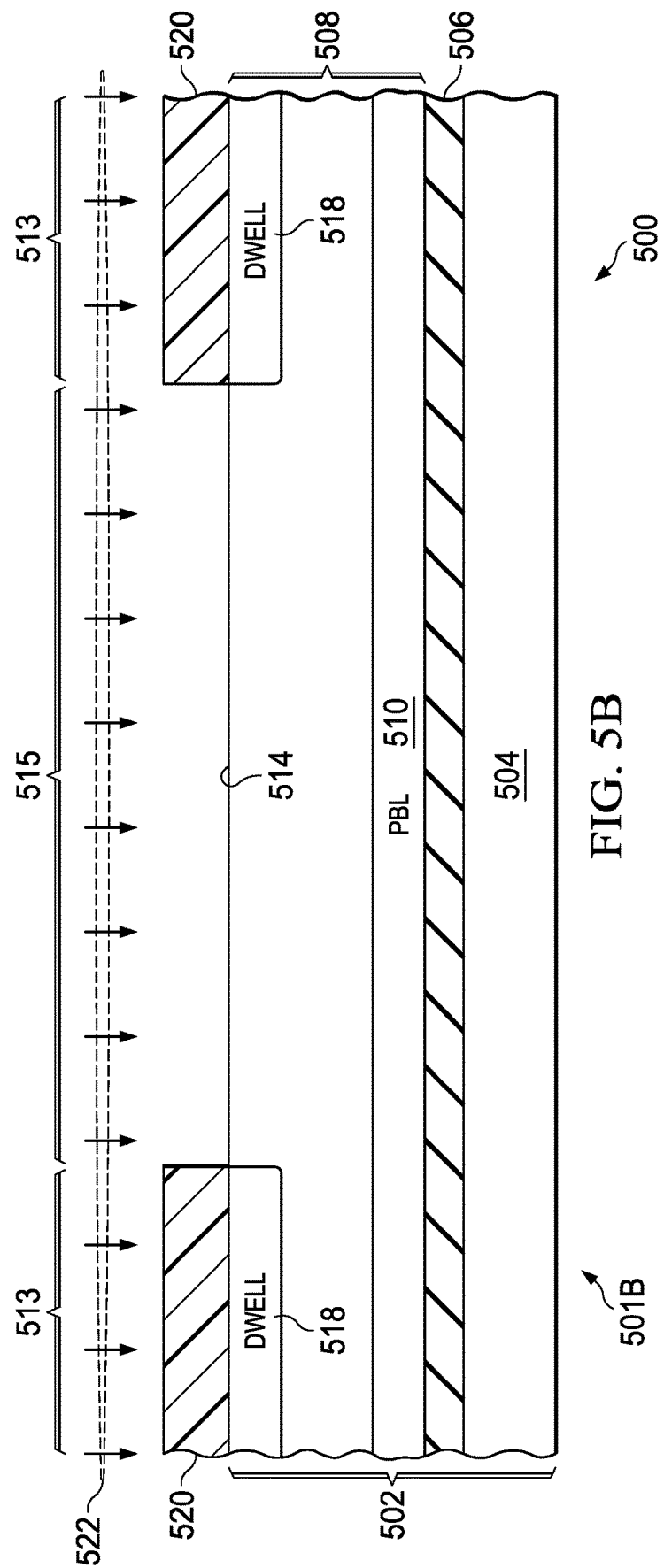

FIG. 5B depicts an IC 500 at a stage 501B that is after implantation of a DWELL region 518, which may also be called a first P-type region 518. The DWELL photoresist layer 512 (FIG. 5A) has been removed and an NWELL photoresist layer 520 has been deposited, patterned, and etched on the surface 514 of the silicon layer 508. The NWELL photoresist layer 520 exposes regions where NWELLs are desired and covers other regions, including the white space region 513. An NWELL implantation process 522 is in progress to implant an N-type dopant, which may be phosphorus, into the exposed regions. In one implementation, the NWELL implantation process may use energy in the range of MeVs, but less than the energy used for the DWELL implantation process.

The method 600 may continue with forming a second P-type region under the first P-type region (625). The second P-type region has a third sheet resistance that is greater than the first sheet resistance and a third dopant dosage that is less than the first dopant dose. The method 600 may continue to form a third P-type region between the first P-type region and the second P-type region (630). The third P-type region has a fourth sheet resistance that is greater than the first sheet resistance and a fourth dopant dosage that is less than the first dopant dose. In the implementation disclosed in this application, the second P-type region may be a PWELL region and the third P-type region may be an SPWELL region. In one implementation, the PWELL region and the SPWELL region are fabricated using respective boron dosages that are an order of magnitude less than the dosage used in the DWELL region and respective energies that are in the range of hundreds of electron volts (eV).

Figure 5C:
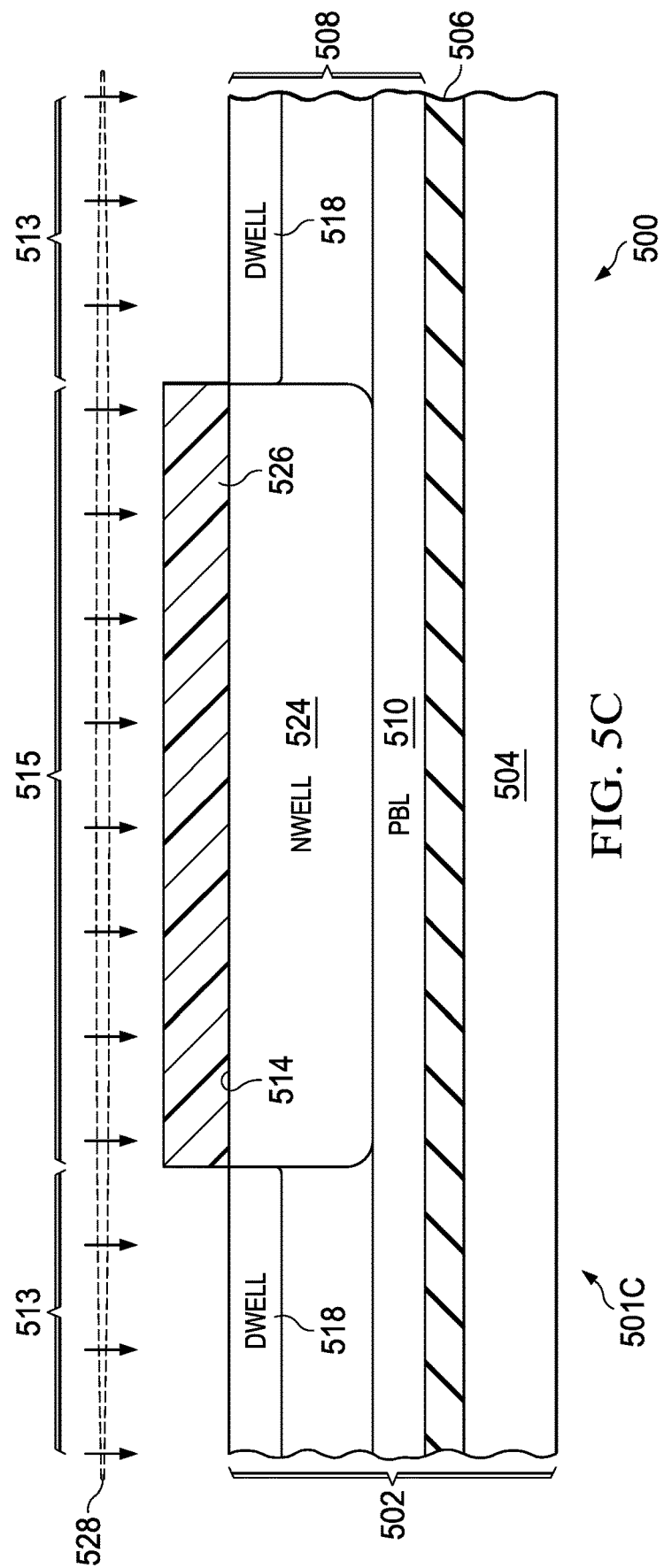

FIG. 5C depicts an IC 500 at a stage 501C after NWELL regions, including NWELL region 524, have been implanted and the NWELL photoresist layer 520 has been removed. A photoresist layer 526 has been deposited and patterned to cover the NWELL region 524 and other regions to be protected while PWELL regions and SPWELL regions (neither are specifically shown) are formed. Although the PWELL regions and the SPWELL regions are not generally implanted using a single photoresist layer, the PWELL regions and the SPWELL regions may both be implanted into the white space region 513 and are thus both represented herein by the photoresist layer 526 while a respective implantation process 528 is performed. A PWELL photoresist layer, which may be represented here by the photoresist layer 526, is deposited and patterned to protect regions such as the NWELL 524 and to expose other regions, which include the white space region 513. A PWELL implantation process, which may be represented here by the implantation process 528, implants a P-type dopant, which may be boron. Once the PWELL implantation process is complete, the associated photoresist layer is removed.

An SPWELL region may also be provided in the white space region 513. If desired, an SPWELL photoresist layer, which may again be represented here by the photoresist layer 526, is deposited and patterned to protect regions such as the NWELL 524 and to expose other regions, which include the white space region 513. An SPWELL implantation process, which may again be represented here by the implantation process 528, implants a P-type dopant, which may be boron. Once the SPWELL implantation process is complete, the associated photoresist layer is removed.

After the PWELL region and the SPWELL region are implanted, an oxide layer or other dielectric may be formed over the silicon layer (635) and a polysilicon plate or other semiconductor plate may be formed over the oxide layer (640). In one implementation, forming the oxide layer may be done as part of forming a gate oxide layer.

Figure 5D:
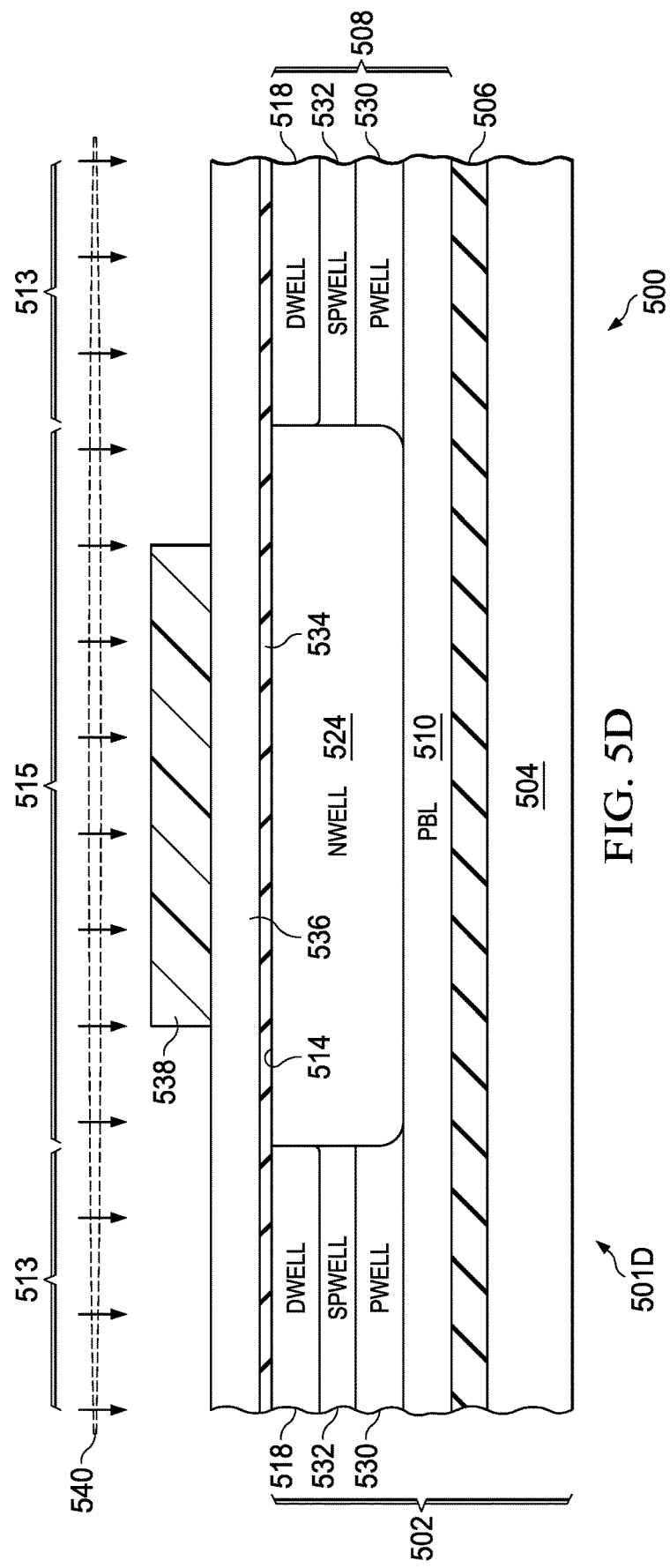

FIG. 5D depicts an IC 500 at a stage 501D after the P-type regions have been implanted, including PWELL region 530 and SPWELL region 532. An oxide 534 or other dielectric has been deposited or grown on the surface 514 of the silicon layer 508. In an example implementation of forming the polysilicon plate, a polysilicon layer 536 has been deposited on the oxide 534. A photoresist layer, e.g., a gate photoresist layer 538 has been deposited and patterned to protect regions that are destined to be transistor gates or capacitor upper plates and to expose remaining portions of the polysilicon layer 536. An etch process 540 is in progress to form a polysilicon plate for the capacitor 515 being fabricated.

Figure 5E:
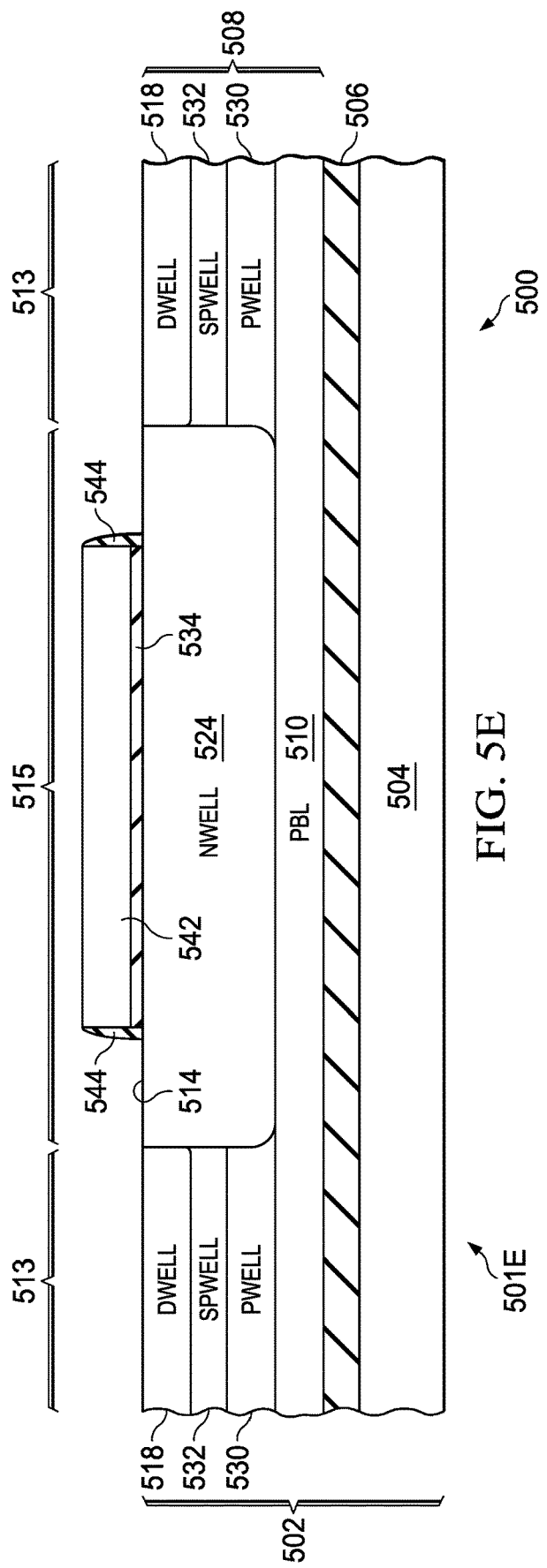

FIG. 5E depicts an IC 500 at a stage 501E after a polysilicon plate 542 has been fabricated and sidewall spacers 544 have been formed around the polysilicon plate 542. The sidewalls spacers 544 may be formed as is known through the deposition of a dielectric, e.g., an oxide, followed by a blanket etch process that removes the dielectric except where structures such as the polysilicon plate 542 cause an uneven etch to form the sidewall spacers 544.

Applicants have disclosed two methods of protecting electronic devices such as capacitors that contain NWELL regions and are also adjacent to white space. The methods protect the electronic devices from the migration of contaminants into the NWELL regions, where the contaminants may cause GOI failures. One method provides sacrificial NWELL rings between the capacitor NWELL regions and the white space; the sacrificial NWELL rings receive contaminants from the white space and prevent migration into the NWELL regions of the electronic devices. The second method modifies the white space to be more attractive to the contaminants than the NWELL regions by providing a P-type region that has a lower sheet resistance than the NWELL regions, so that the contaminants can be prevented from migrating. Each of these methods can be used to provide an IC that may have lower GOI failures while using the existing fabrication methods. An implementation may also combine the two methods and use a modified white space having a lower sheet resistance and a roughened surface in combination with sacrificial NWELL rings.

Although various implementations have been shown and described in detail, the claims are not limited to any particular implementation or example. None of the above Detailed Description should be read as implying that any particular component, element, step, act, or function is essential such that it must be included in the scope of the claims. Reference to an element in the singular is not intended to mean "one and only one" unless explicitly so stated, but rather "one or more." All structural and functional equivalents to the elements of the above-described implementations that are known to those of ordinary skill in the art are expressly incorporated herein by reference and are intended to be encompassed by the present claims. Accordingly, those skilled in the art will recognize that the exemplary implementations described herein can be practiced with various modifications and alterations within the spirit and scope of the claims appended below.

What is claimed is:

1. A semiconductor device, comprising:
   a semiconductor-on-insulator (SOI) substrate including a semiconductor layer on an insulator layer;
   an N-type well (NWELL) region in the semiconductor layer, the NWELL region including a semiconductor component; and
   a white space region in the semiconductor layer, the white space region laterally surrounding the NWELL region, wherein the white space region has a greater surface roughness than the NWELL region.

2. The semiconductor device of claim 1, wherein the white space region includes one or more p-type well (PWELL) regions.

3. The semiconductor device of claim 2, wherein the one or more PWELL regions include a first PWELL region extended from a surface of the semiconductor layer, the first PWELL region having a first sheet resistance less than the NWELL region.

4. The semiconductor device of claim 3, wherein the first sheet resistance of the first PWELL region is less than the NWELL region by about 100 Ω/square.

5. The semiconductor device of claim 3, wherein the first sheet resistance of the first PWELL region is less than the NWELL region by about one order of magnitude.

6. The semiconductor device of claim 3, wherein the one or more PWELL regions include a second PWELL region underneath the first PWELL region, the second PWELL region having a second sheet resistance greater than the NWELL region.

7. The semiconductor device of claim 6, wherein the second sheet resistance of the second PWELL region is 4 to 5 times greater than the NWELL region.

8. The semiconductor device of claim 6, wherein the one or more PWELL regions include a third PWELL region underneath the second PWELL region, the third PWELL region having a third sheet resistance that is in the same range as the second sheet resistance.

9. The semiconductor device of claim 1, further comprising:
   a P-type buried layer (PBL) in the semiconductor layer, the PBL being over the insulator layer and under the NWELL region.

10. The semiconductor device of claim 1, wherein the semiconductor component includes a dielectric layer over the NWELL region and a conductive plate over the dielectric layer.

11. The semiconductor device of claim 10, wherein the conductive plate includes polysilicon.

12. The semiconductor device of claim 1, wherein the white space region abuts the NWELL region.

13. A semiconductor device, comprising:
   a semiconductor-on-insulator (SOI) substrate including a semiconductor layer on an insulator layer;
   an N-type well (NWELL) region in the semiconductor layer, the NWELL region extended from a surface of the semiconductor layer; and
   a P-type well (PWELL) region in the semiconductor layer, the PWELL region laterally surrounding the NWELL region and extended from the surface of the semiconductor layer, wherein the PWELL region has a sheet resistance less than the NWELL region.

14. The semiconductor device of claim 13, wherein the PWELL region has a greater surface roughness than the NWELL region.

15. The semiconductor device of claim 13, wherein the sheet resistance of the PWELL region is less than the NWELL region by about 100 Ω/square.

16. The semiconductor device of claim 13, wherein the sheet resistance of the PWELL region is less than the NWELL region by about one order of magnitude.

17. The semiconductor device of claim 13, wherein the PWELL region is a first PWELL region and the sheet resistance is a first sheet resistance, the semiconductor device further comprising:
  a second PWELL region underneath the first PWELL region, the second PWELL region having a second sheet resistance greater than the NWELL region.

18. The semiconductor device of claim 17, wherein the second sheet resistance of the second PWELL region is 4 to 5 times greater than the NWELL region.

19. The semiconductor device of claim 17, further comprising:
  a third PWELL region underneath the second PWELL region, the third PWELL region having a third sheet resistance that is in the same range as the second sheet resistance.

20. The semiconductor device of claim 13, further comprising:
  a P-type buried layer (PBL) in the semiconductor layer, the PBL being over the insulator layer and under the NWELL region.

21. The semiconductor device of claim 20, wherein the NWELL region extends from the surface of the semiconductor layer to the PBL.

22. The semiconductor device of claim 13, wherein the NWELL region includes a semiconductor component having a dielectric layer over the NWELL region and a conductive plate over the dielectric layer.

23. The semiconductor device of claim 22, wherein the conductive plate includes polysilicon.

24. The semiconductor device of claim 13, wherein the PWELL region abuts the NWELL region.

* * * * *